United States Patent [19]

Jacobs et al.

[11] Patent Number: 4,636,964
[45] Date of Patent: Jan. 13, 1987

[54] METHOD AND SYSTEM FOR GENERATING AND ADJUSTING A PREDETERMINED QUANTITY OF MUTUALLY INDEPENDENT DIRECT CURRENT VOLTAGES

[75] Inventors: Hanno Jacobs, Langenfeld; Ulrich Opara, Erfstadt-Köttingen; Franz Selleschy, Solingen, all of Fed. Rep. of Germany

[73] Assignee: Krautkramer-Branson, Inc., Lewistown, Pa.

[21] Appl. No.: 486,718

[22] Filed: Apr. 20, 1983

[30] Foreign Application Priority Data

May 4, 1982 [DE] Fed. Rep. of Germany ....... 3216547

[51] Int. Cl.$^4$ .............................................. G06F 15/20
[52] U.S. Cl. ............................ 364/483; 340/347 DA
[58] Field of Search ................ 364/483; 340/347 DA; 328/14; 358/185

[56] References Cited

U.S. PATENT DOCUMENTS

| | | | |
|---|---|---|---|
| 3,893,102 | 7/1975 | Candy | 340/347 DA |
| 4,005,409 | 1/1977 | Fever | 340/347 DA |
| 4,039,806 | 8/1977 | Fredriksson et al. | 328/14 |
| 4,064,423 | 12/1977 | Atkisson, Jr. | 340/347 DA |
| 4,123,716 | 10/1978 | Borg | 325/464 |
| 4,310,855 | 1/1982 | Holzgrafe | 358/185 |

FOREIGN PATENT DOCUMENTS 2520676 11/1975 Fed. Rep. of Germany .
2828849 2/1979 Fed. Rep. of Germany .
2920016 11/1979 Fed. Rep. of Germany .
1540459 2/1979 United Kingdom .

Primary Examiner—Gary Chin
Attorney, Agent, or Firm—Ervin B. Steinberg; Philip J. Feig

[57] ABSTRACT

This invention relates to a method and circuits for the generation and rapid adjustment of direct current voltages, such method and circuits being used particularly for the adjustment of amplifiers, and amplitude and time gates in ultrasonic test instruments. The voltage to be generated is selected by a selector switch and its value is increased or decreased by means of a set switch. For this purpose, the appropriate contents of storage locations of a read-write memory (RAM) are successively read out of the memory for setting the count of a binary counter. The count may be incremented, decremented or left unchanged according to the position of the set switch and of the selector switch. The binary counter contents are then written back into the appropriate storage location of the memory and converted by a digital-to-analog converter (DAC) to an analog value and stored temporarily by means of a capacitor. The individual locations of the memory are successively and cyclically read out so that a continuously recurring sequence is obtained. During each individual cycle the voltage value can be changed by zero or one digital increment. In an alternative embodiment, the repetition frequency is increased by means of a voltage controlled oscillator (VCO) for reducing the time required to complete each individual cycle.

7 Claims, 8 Drawing Figures

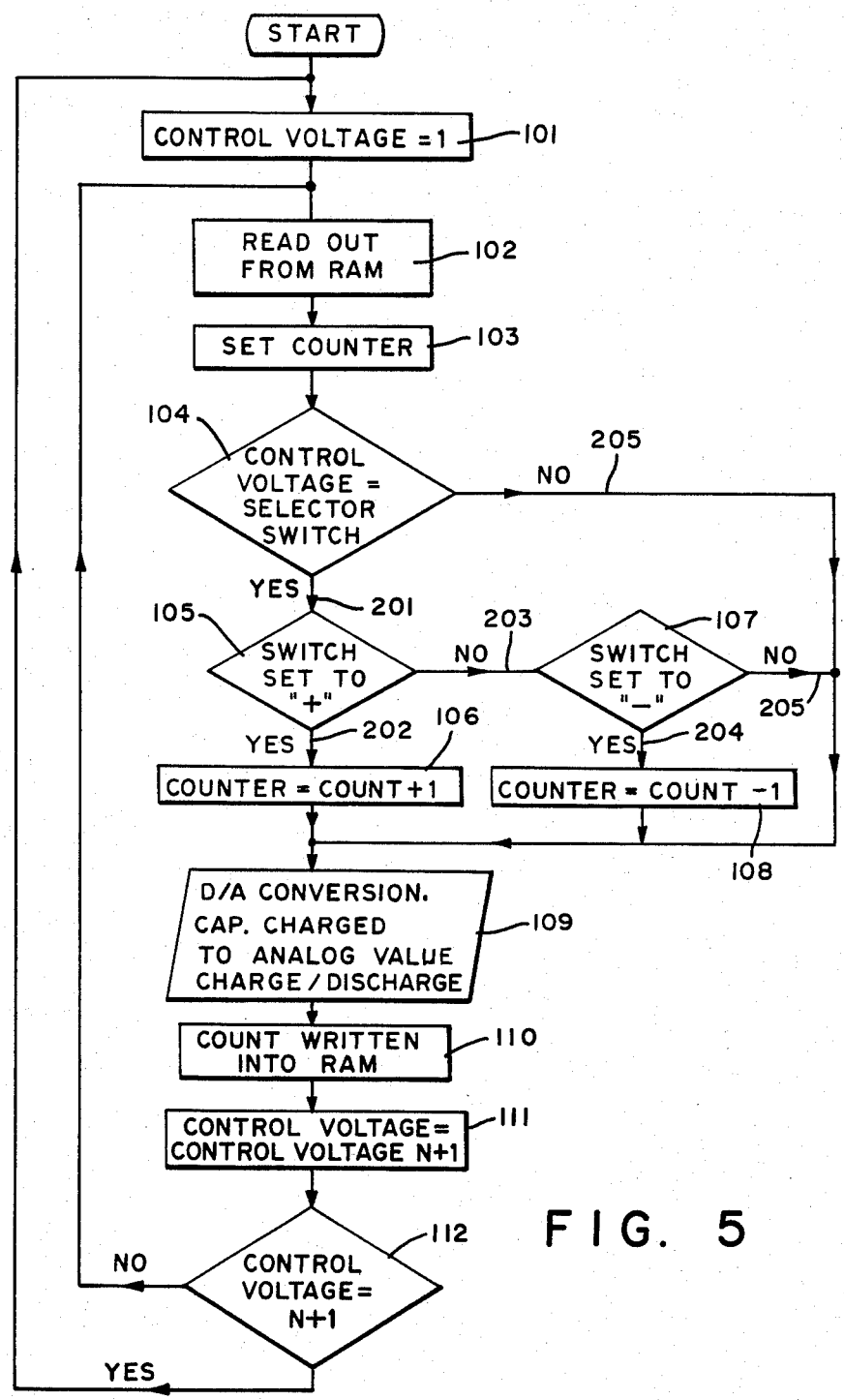

METHOD AND SYSTEM FOR GENERATING AND ADJUSTING A PREDETERMINED QUANTITY OF MUTUALLY INDEPENDENT DIRECT CURRENT VOLTAGES

BACKGROUND OF THE INVENTION

This invention relates to a method for generating and adjusting a predetermined quantity of mutually independent direct current voltages by converting corresponding digital values stored in read-write memory (RAM) using a digital-to-analog converter (DAC). The invention also relates to a system for practicing the method. More particularly, the invention refers to the use of the method and system in an ultrasonic test instrument of the kind used for ultrasonic nondestructive testing of materials.

For the purpose of adjusting electronic equipment or adapting such equipment to different operating conditions it is often necessary to provide d.c. voltages which remain constant during a given measurement period but can then be adjusted very rapidly. Direct current voltages of this kind are required, for example, for setting evaluation threshold levels of an amplitude gate, for changing gate times, and for indicating pulse signal peaks on a display screen of an ultrasonic test instrument.

The general practice is to generate these adjustable d.c. voltages by means of potentiometer circuits. The potentiometer circuit has the disadvantage of requiring each d.c. voltage to be produced by a separate potentiometer on the front or control panel of the equipment. In such cases, apart from the considerable amount of space required, manual adjustment of the equipment is complicated and errors can occur very easily in operation.

In radio and television technology it is known to generate a plurality of mutually independent d.c. voltages using, for example, just one potentiometer or other means, to convert the d.c. voltages to digital values by means of an analog-to-digital converter (ADC) and store the values in digital memories so that they will be available as d.c. voltages upon recall and digital-to-analog conversion. These known devices are designed specifically to provide d.c. voltages to control voltage-variable capacitors for tuning the equipment to a predetermined reception freqency (see, for example, German Offenlegungsschrift No. 25 20 676). Since these d.c. voltages are generated simultaneously, a disadvantage of the equipment is that a separate DAC is required for each d.c. voltage to be set. Another disadvantage is that the d.c. voltages to be stored initially have to be produced by means of at least one potentiometer or an up/down counter, and the voltage has to be produced anew for each change of value. Under such conditions it is imposible or too cumbersome to obtain a permanent and rapidly adjustable arrangement for the d.c. voltages, because the d.c. voltages have to be preset by means of a control element.

BRIEF SUMMARY OF THE INVENTION

A principal object of the invention is therefore, the provision of a method of the kind described which is rather simple and inexpensive to perform and by which the selectable d.c. voltages can be changed or adjusted very rapidly.

Another object of the invention is the provision of a system for practicing the invention.

The particular advantage of this invention, in the case of equipment requiring a plurality of d.c. voltages (parameters) to be set, is that these voltages can be digitally set simply by means of two switch elements. Initially, the appropriate voltage (parameter) to be changed is selected by means of a selector switch. Subsequently, the corresponding voltage value is changed, for example by means of a push-button or toggle switch. The push-button switch is actuated until a respective predetermined value is reached. A particular advantage of this arrangement becomes apparent when using small ultrasonic test instruments for nondestructive testing of materials in which the quantity of adjustment knobs previously required for setting the gate values, measurement ranges, amplification control, and so on, greatly complicated operation and set-up of the instrument for the ultrasonic test operator.

Other objects of the invention will become apparent when reading the specification in conjunction with the accompanying drawings.

BRIEF DESCRIPTION OF THE DRAWINGS

FIG. 5 is a simplified flow diagram of the sequence of steps, particularly when using a microprocessor;

DETAILED DESCRIPTION OF THE INVENTION

Figure 1:
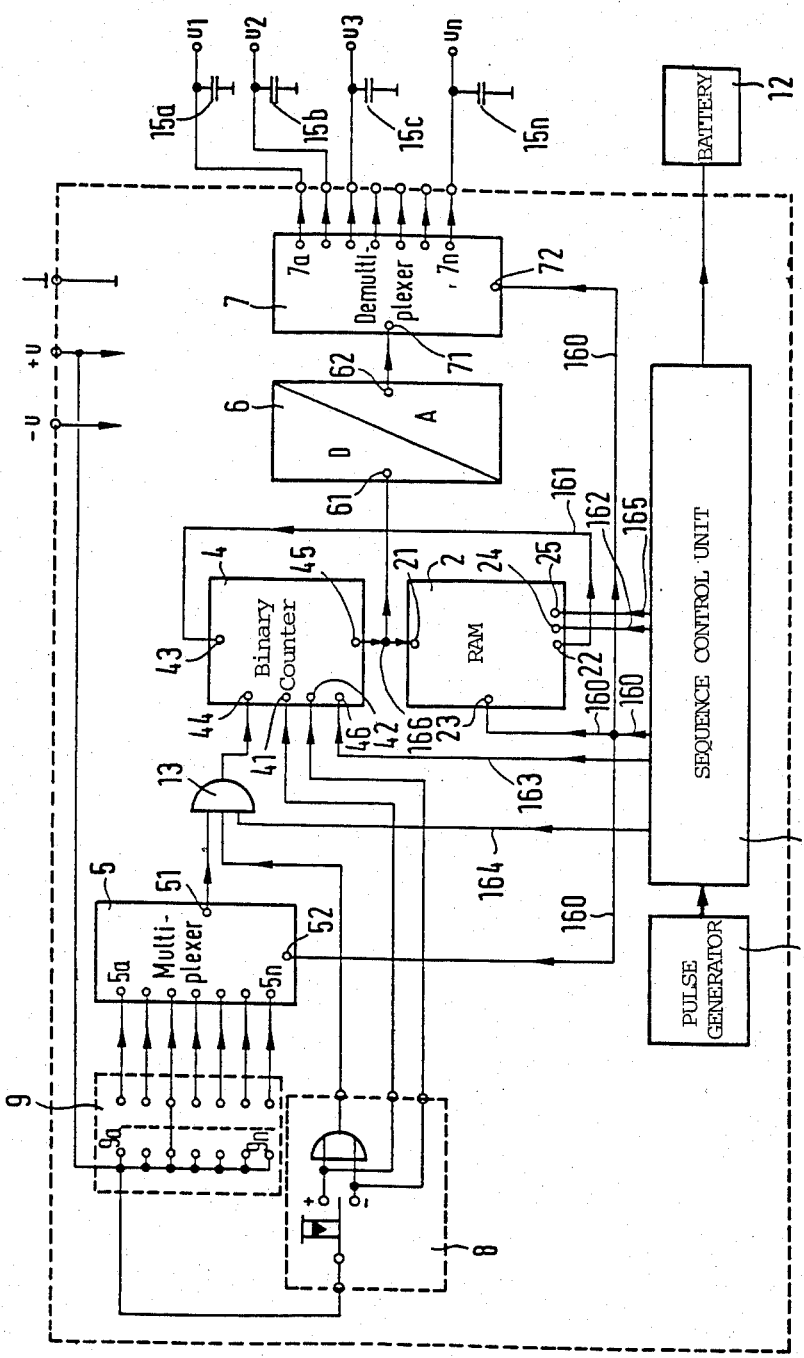
FIG. 1 is a schematic block diagram of a circuit embodying the invention.

Referring to the figures and FIG. 1 in particular, the inputs 5a to 5n of a multiplexer 5 are connected to respective contacts 9a to 9n of a selector switch 9. The multiplexer 5 output 51 is coupled to a first input of an AND gate 13. A second input of the AND gate 13 is connected to a set switch 8 and a third input is connected to an output of an sequence control unit 1. The latter is controlled by a pulse generator 11 containing a binary divider (not shown). The output of the AND gate 13 is provided to the input 44 of a pre-settable binary counter 4. The preset input 43 of the binary counter 4 is connected to the output 22 of a read-write memory (RAM) 2. The input 21 of the memory 2 is connected to the output 45 of the binary counter 4. The input 61 of a digital-to-analog converter (DAC) 6 is also connected to the output 45 of counter 4. The input 71 of a demultiplexer 7 is connected to the output 62 of the DAC 6. The outputs 7a to 7n of the demultiplexer 7 are coupled to respective capacitors 15a to 15n for temporary storage of the d.c. voltages generated at the outputs 7a to 7n of the demultiplexer 7. Sequence control unit 1 is connected via conductor 160 to the multiplexer 5, the read-write memory 2 and the demultiplexer 7 for addressing the three mentioned units for each of the individual voltages. Also shown in FIG. 1 is a buffer battery 12 which is connected to the read-write memory 2 via the sequence control unit 1 so that the contents of the read-write memory are retained during any interruptions in operation.

Figure 2:
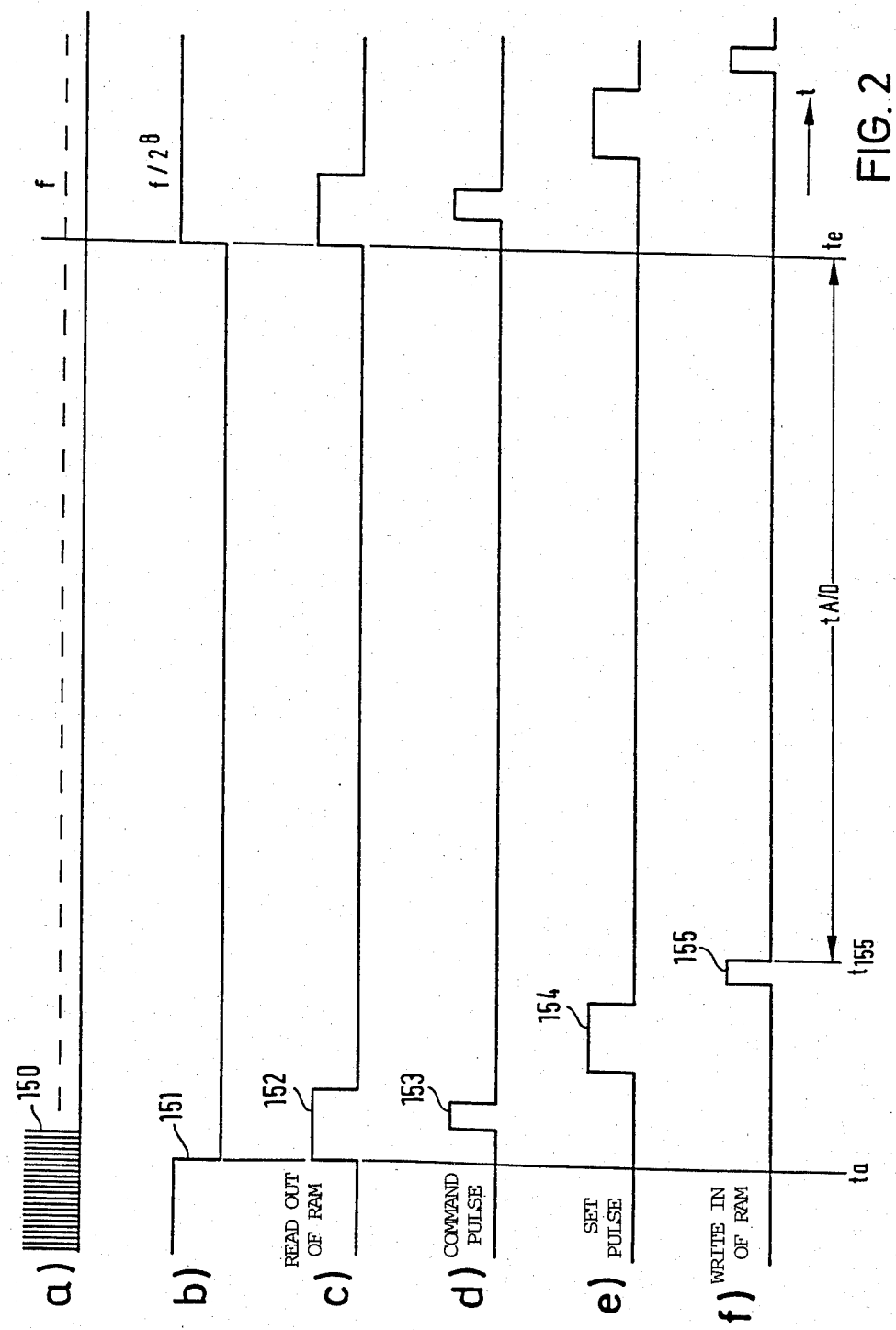
FIG. 2 illustrates the graphic representations of pulses versus time in order to describe the invention.

FIG. 2 shows some of the pulses generated in the sequence control unit 1. FIG. 2 in (a) shows the pulse train 150 of frequency f generated by the pulse generator 11. The binary divider (not shown) in the sequence control unit 1 receives the pulse train 150 and, in turn, produces the pulses 151 to 155 shown in (b) to (f). The reference ta denotes the start and te the end of a specific cycle. A cycle is determined by the high and subsequent low condition of the pulse 151 (FIG. 2b). The pulse 151 is produced by binary division from the pulse train 150, e.g. in the form of the derived frequency $f/2^8$. Other frequencies $f/2^1$, $f/2^2$ to, for example, $f/2^{10}$, produced from the pulse train 150 at frequency f, are not shown. Of these pulses, the frequencies $f/2^8$, $f/2^9$ and $f/2^{10}$ for example, are required as addresses for the multiplexer and demultiplexer.

In order to describe the method it is assumed that initial values are stored in the appropriate memory locations of the read-write memory 2. These initial values may be random values or originate from previous operational phases of the test procedures. The memory contents can be retained during interruptions in operation by means of the buffer battery 12.

During a first cycle, which is addressed by the sequence control unit 1 via lead 160, the duration of which is defined by change of state of the pulse 151, the storage location of the read-write memory 2 associated with that particular cycle is addressed. The pulse 152 is fed via conductor 162 to the read input 24 of the read-write memory 2. During the entire period of the pulse 152 the contents of the addressed storage location is provided at the preset input 43 of the binary counter 4 via the conductor 161. During this pulse 152 period, the counter receives the command pulse 153, provided via conductor 163, to accept the contents of the addressed storage location. During this time, the counter 4 cannot receive a set pulse at its set input 44 from the AND gate 13, since the AND gate 13 continues to be closed because the contact 9a of the selector switch 9 remains open. By means of the pulse 155 fed via conductor 165 to the write input 25 of the read-write memory 2, the memory 2 is made to accept via conductor 166 the output of counter 4 into the addressed memory location. From the end of the pulse 155 ($t_{155}$) to the end of the cycle (te), (i.e., during the time tA/D) the contents of counter 4 are present at the input 61 of the DAC 6, where the contents are converted to an analog voltage U1. This analog voltage U1 is fed through the demultiplexer 7 to the respective storage capacitor 15a provided for the voltage U1. Advantageously, it is only necessary for the capacitor 15a to have a capacitance such as to maintain the analog voltage U1 for the duration of the following cycles, i.e. until this first cycle is addressed again. If the next cycle is addressed after the time te, the operation already described takes place for the memory location of the read-write memory 2 that is now addressed and the corresponding analog voltage U2 is stored in the form of a voltage U2 by the capacitor 15b.

Figure 3:
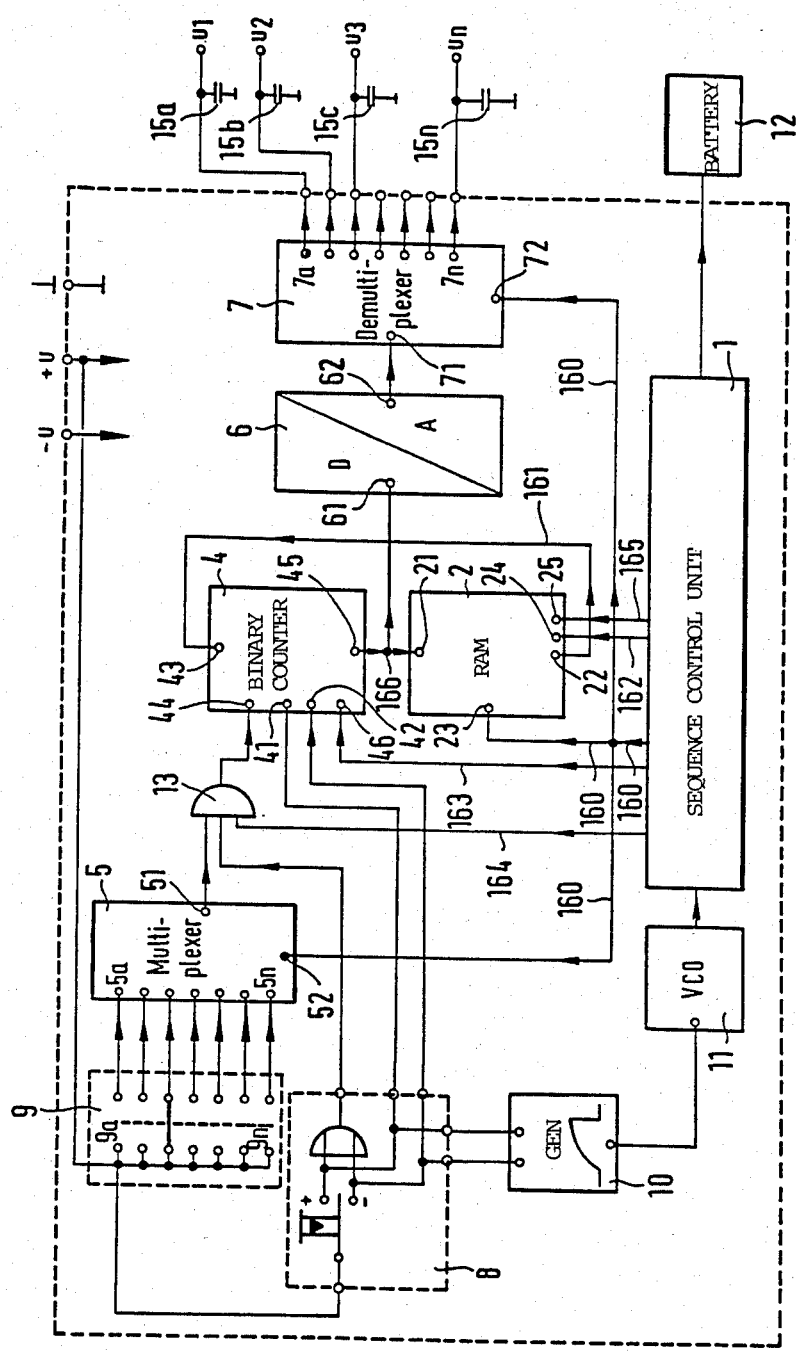
FIG. 3 is a schematic block diagram of a circuit which is a modification of the circuit shown in FIG. 1.

If the third cycle is then addressed as already described, the contents of the corresponding memory location of the read-write memory 2 is fed to the counter 4. It is assumed that during this cycle the AND gate 13 receives a voltage at its first input via the multiplexer 5 from the selector switch 9 through the closed contact 9c as shown in FIGS. 1 and 3. If the set switch 8 has been actuated to either the negative or positive position, the second input of the AND gate also receives a voltage. With the simultaneous occurrence of the pulse 154 along conductor 164, the third input of the AND gate also has a voltage, causing the AND gate 13 to become open so that the set input 44 of the counter 4 receives a set command from the leading edge of the pulse 154. Depending upon whether the set switch 8 was set to the negative or to the positive position, the counter 4 is accordingly set to count forward or backward via the counting direction inputs 41 or 42. The counter, having already been preset to the contents of the specifically addressed memory location of the read-write memory 2, will be incremented or decremented by one count. By means of the pulse 155, the now changed count value in counter 4 is written, as previously described, as an actual value in the appropriate memory location of the read-write memory 2, and is also fed to the DAC 6. Subsequently, the capacitor 15c is recharged to a new voltage value U3. This new voltage value differs from the preceding value by the equivalent of one count. The next cycles, i.e. cycles 4 to n, then occur in exactly the same manner as cycles 1 and 2.

Once cycle n is completed, the cycles 1 to n follow in a constant repetition. Since switch contact 9c remains closed during each of these successive repetitions, the voltage U3 is changed by the equivalent of one count, provided the selector switch 9 and the set switch 8 remains actuated. In the described arrangement, to adjust a voltage by k counts requires only k repetitions of the cycle sequence.

Assuming that a brief actuation of the set switch 8 (about 0.1 s) changes the voltage by a single count, it is then possible to estimate how long it takes to change a voltage from a minimum value to a maximum value. If, for example, a frequency of 11 kHz is selected for the pulse generator 11 and if the range of adjustment of the voltages to be changed are each divided into 256 digital counts, then, in order to traverse the entire adjustment range, the time required for each range to be set is about 21 seconds. The following explanation shows how this time is arrived at:

The pulse 151 defines one cycle in each state of the pulse. Given a pulse repetition frequency of 11 kHz for pulses 150, a cycle lasts $\frac{1}{2} \times 2^8/11$ kHz=11.6 milliseconds. Assuming that it is required to generate seven voltages and change them at will, i.e., seven cycles form a cycle sequence (n=7), then a cycle sequence will last about 81 milliseconds. In order to now change an analog voltage by 256 digital steps, the time required is 256×81 ms, or approximately 21 seconds.

FIG. 3 shows a modification of the circuit which has an advantage over the circuit per FIG. 1 in that the set time is greatly reduced by the addition of a function generator 10. This function generator 10 increases the pulse repetition frequency f as a function of time, i.e. the frequency of the pulse train 150 from the pulse generator 11. After actuation of the set switch 8, the pulse generator 11 initially oscillates at its basic frequency i.e. 11 kHz in this example. As the time during which the set switch 8 is operated increases, the function generator 10 increases its output voltage and, hence, increases the frequency of the pulses from the generator 11 to 170 kHz for example. For this purpose the pulse generator must be a voltage controlled oscillator (VCO). The high pulse frequency is obtained after just a few seconds of actuation of the set switch 8. At this higher frequency and with the reduction of the cycle time as a result of the binary division, the average adjustment time required to cover the entire range of adjustment of the voltage is reduced to only a few seconds. For example, a long actuation of the set switch 8 will provide a coarse presetting of the voltage, which can be brought to the exact required value by short-duration actuation.

Figure 4:
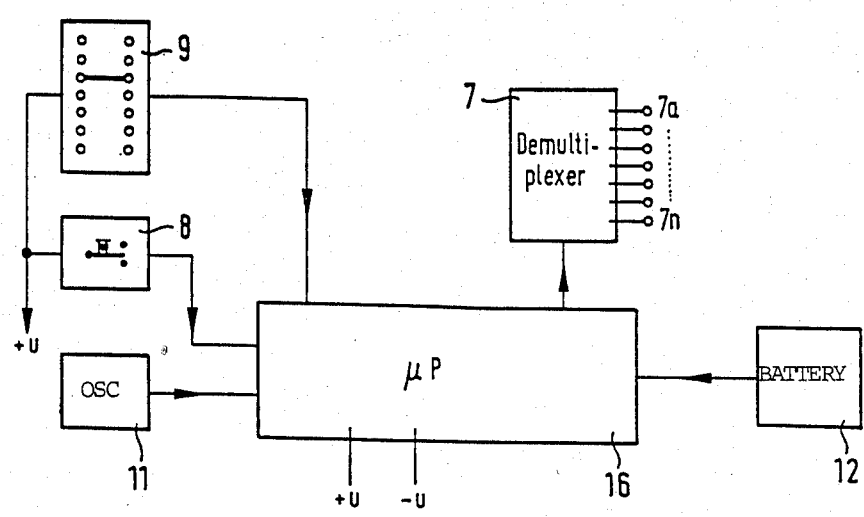
FIG. 4 is a schematic block diagram of a circuit for practicing the invention using a microprocessor.

As best shown in FIG. 4, the method according to the invention is also advantageous for use with microprocessors. This example illustrates a microprocessor 16 which replaces the functions of the sequence control unit 1, multiplexer 5, binary counter 4, read-write memory 2 and the DAC 6. The selector switch 9, set switch 8, demultiplexer 7, pulse generator 11 and buffer battery 12 are then externally connected to the microprocessor 16.

FIG. 5 is a simplified flow diagram for the microprocessor 16. This flow diagram can also be used in conjunction with the descriptions of the circuits shown in FIGS. 1 and 3. The flow diagram starts with a first adjustable voltage, block 101. The storage location of the read-write memory 2 associated with this adjustable voltage is read out, block 102. A counter or accumulator of the microprocessor 16 is set to the value of the memory location contents, block 103. Block 104 is interrogated as to whether the selector switch 9 contact associated with the respective voltage has been closed. In the event of confirmation (201) (i.e. an affirmative answer) the next question is whether the set switch 8 has been set to plus, block 105. If so (202), the counter is incremented by one count, block 106. If not (203), the next question is whether the set switch has been set to minus, block 107. If so (204) the counter is decremented by one count, block 108. If the set switch 8 has not been actuated, i.e. there is no confirmation at 201, the counter remains unchanged (205). If there is no confirmation at block 104 that the selector switch 9 associated with this voltage has been closed (205) the counter again remains unchanged. The actual count in the converter is converted to an analog value and the storage capacitor associated with the voltage is charged or discharged to this analog value, block 109. The actual count of the counter is also written back into its associated storage location in the read-write memory 2, block 110. The next adjustable voltage is then addressed, block 111. When all the adjustable voltages have been cycled, the first voltage is again addressed, block 112. This sequence is thus repeated continually.

Figure 6:
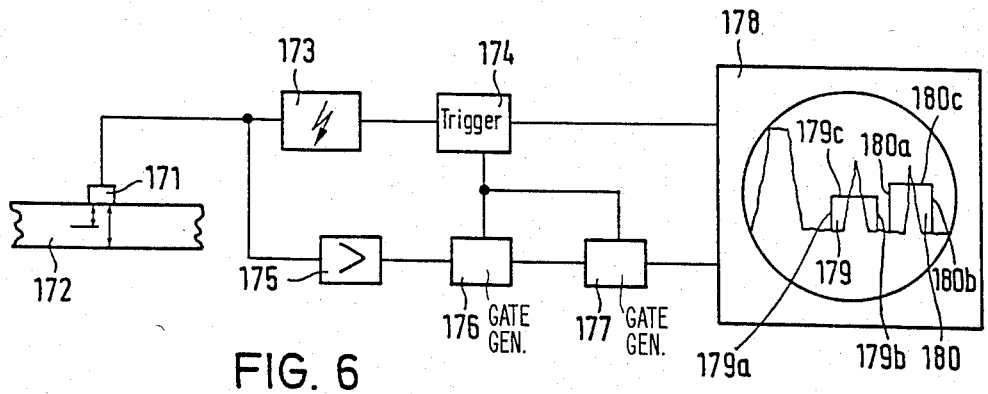
FIG. 6 is a schematic block diagram of an ultrasonic test instrument in which the circuit can be used.

FIG. 6 shows a known circuit used for the ultrasonic testing of materials. Reference numeral 171 denotes an ultrasonic probe acoustically coupled to a workpiece 172. The probe 171 receives electrical transmit pulses from transmitter 173 and converts the transmit pulses into ultrasonic transmit pulses. The transmitter 173 is controlled by a trigger storage 174. In this example, the same test probe 171 receives the echo pulses reflected back from acoustic reflectors in the workpiece 172, and converts the reflected echo pulses into electrical pulses. The electrical pulses are fed, in turn, to gate units 176 and 177 via an amplifier 175, the sensitivity threshold of the amplifier 175 being adjustable. After passing through gate units 176 and 177 the electrical pulses are fed to the display stage of the ultrasonic test instrument and displayed on CRT screen 178. The gates 179 and 180 generated in gate generator units 176 and 177 can be adjusted with respect to the gate width duration and time position (time masking) by varying their respective start times 179a and 180a, and their respective end times 179b and 180b. The respective evaluation thresholds 179c and 180c (amplitude thresholds) are also adjustable for each time gate 179 and 180. The time gates are displayed on the screen in the form of rectangular pulses 179 and 180. The effect of these gate units 176 and 177 is that only ultrasonic echo signals occurring during the respective gated time intervals 179, 180 are displayed on the screen 178 of the ultrasonic test instrument and only when their respective amplitudes are greater than the evaluation thresholds 179c, 180c to which the instrument has been set at any specific time.

Figure 7:
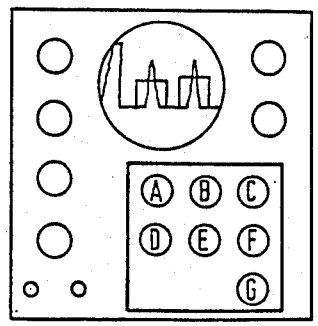
FIG. 7 is an elevational view of the front panel of an ultrasonic test instrument of the type shown in FIG. 6.

The frame area of FIG. 7 is an example of a conventional arrangement of the control knobs on the front panel of an ultrasonic test instrument for performing the following seven parameter adjustments:

A: Start 179a of the first time gate 179
B: End 179b of the first time gate 179
C: Evaluation threshold level 179c of the gate 179
D: Start 180a of the second time gate 180
E: End 180b of second time gate 180
F: Evaluation threshold level 180c of the time gate 180
G: Sensitivity threshold of amplifier 175.

Figure 8:
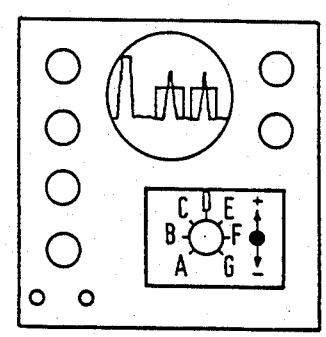
FIG. 8 is an elevational view of a front panel of an ultrasonic test instrument of the type shown in FIG. 6 in which one of the circuits disclosed in the present invention is incorporated.

The frame area of FIG. 8 illustrates a simplified arrangement of front panel controls of a modified ultrasonic test instrument for adjusting the same seven parameters with the instrument containing one of the circuits described above. Only a single selector switch 9 with the positions A to G for selecting one of the seven parameters, and a set switch (in black) for increasing or decreasing the parameter values (adjustable voltages), i.e. setting the switch to the positive or negative symbol, is required when using the circuit described for adjusting the parameter values to the desired values.

What is claimed is:

1. A method of generating and adjusting a predetermined quantity of mutually independent direct current voltages by converting corresponding digital values stored in a read-write memory using a digital-to-analog converter comprising:
    (a) reading out from the memory stored data corresponding to a selected one of said predetermined quantity of voltages and setting a pre-settable counter to a count commensurate with said stored data;
    (b) causing said counter to change its count responsive to a command for increasing or decreasing the selected voltage;
    (c) writing into the memory corresponding to the selected voltage data commensurate with the changed count from said counter;
    (d) converting said changed count to an adjusted direct current voltage;
    (e) repeating steps a through d for each of said quantity of voltages until each of said voltages is adjusted to its respective required value.

2. A method as set forth in claim 1, wherein said causing said counter to change count, changes the count by one count.

3. A method as set forth in claim 1, wherein said causing said counter to change count reduces the time required for said repeating steps a through d.

4. A system for generating and adjusting a predetermined quantity of mutually independent direct current voltages by converting corresponding digital values stored in a read-write memory using a digital-to-analog converter comprising:

- read-write memory means for storing data corresponding to each of said predetermined quantity of voltages;
- counting means;
- address means coupled to said memory means and said counting means for reading from said memory means said stored data associated with one of said predetermined quantity of voltages and providing a signal to said counting means for presetting said counting means with a count commensurate with said stored data;
- selector switch means for selecting one of said predetermined quantity of voltages to be adjusted;
- set switch means for selecting the direction of counting of said counting means;
- control means coupled to said selector switch means, said set switch means and said counting means for causing when said selector switch means selects said predetermined voltage and said set switch means selects the direction of counting, said counting means to count in said selected direction for providing a changed count;
- said address means causing said changed count to be written into said memory means corresponding to said predetermined voltage;
- voltage generating and adjusting means, including a digital-to-analog converter, coupled to said counting means for converting said changed count into an adjusted direct current voltage, and
- sequencing means coupled to said memory means, said address means, said control means and said voltage generating and adjusting means for sequentially providing adjusted direct current voltages for each of said quantity of mutually independent direct current voltages until each of said voltages is adjusted to its respective required value.

5. The system as set forth in claim 4, wherein said counting means counts one count in said selected direction during each sequence.

6. The system as set forth in claim 4, wherein said control means includes a voltage controlled oscillator for reducing the time required for providing an adjusted direct current voltage.

7. The system as set forth in claim 4, wherein said read-write memory means, said counting means, said address means, said control means, said voltage generating and adjusting means, and said sequencing means comprise a microcomputer.

* * * * *